(12) United States Patent
Utsumi

(10) Patent No.: US 6,983,281 B1
(45) Date of Patent: Jan. 3, 2006

(54) TERMINAL APPARATUS

(75) Inventor: Yoshimasa Utsumi, Tokyo (JP)

(73) Assignee: Sony Corporation, Tokyo (JP)

( * ) Notice: Subject to any disclaimer, the term of this patent is extended or adjusted under 35 U.S.C. 154(b) by 934 days.

(21) Appl. No.: 09/644,599

(22) Filed: Aug. 23, 2000

(30) Foreign Application Priority Data

Aug. 24, 1999 (JP) .............................. P11-236797

(51) Int. Cl.
  *G06F 17/30* (2006.01)
(52) U.S. Cl. .................. 707/101; 707/104.1; 713/200
(58) Field of Classification Search ................ 348/390, 348/404; 705/401, 408; 386/105, 106, 94; 704/211; 381/106; 713/200, 201, 202; 725/104
See application file for complete search history.

(56) References Cited

U.S. PATENT DOCUMENTS

| | | | |
|---|---|---|---|
| 5,091,787 A | | 2/1992 | Watanabe et al. ........ 348/231.9 |
| 5,586,193 A | * | 12/1996 | Ichise et al. ................ 381/106 |
| 5,717,818 A | * | 2/1998 | Nejime et al. .............. 704/211 |
| 5,990,955 A | * | 11/1999 | Koz ....................... 375/240.01 |
| 6,160,953 A | * | 12/2000 | Fuchigami et al. ......... 386/105 |
| 6,381,747 B1 | * | 4/2002 | Wonfor et al. .............. 725/104 |
| 6,418,422 B1 | * | 7/2002 | Guenther et al. ........... 705/401 |
| 6,438,235 B2 | * | 8/2002 | Sims, III .................... 380/285 |

* cited by examiner

*Primary Examiner*—Jeffrey Gaffin
*Assistant Examiner*—Hassan Mahmoudi
(74) *Attorney, Agent, or Firm*—Frommer Lawrence & Haug LLP; William S. Frommer; Darren M. Simon

(57) ABSTRACT

A terminal apparatus into which one of a first and a second memory card is selectively inserted. The first memory card is designed to store contents subject to copyright protection whereas the second memory card is arranged to accommodate contents not subject to copyright protection. The two cards are substantially the same in shape. If a user inadvertently inserts the second memory card into the apparatus in order to record contents subject to copyright protection, the contents are allowed to be recorded to the inserted card at a lowered level of data quality. This averts an outright failure to record copyright-protected contents for which the user has properly paid to a copyright-noncompliant memory card.

19 Claims, 9 Drawing Sheets

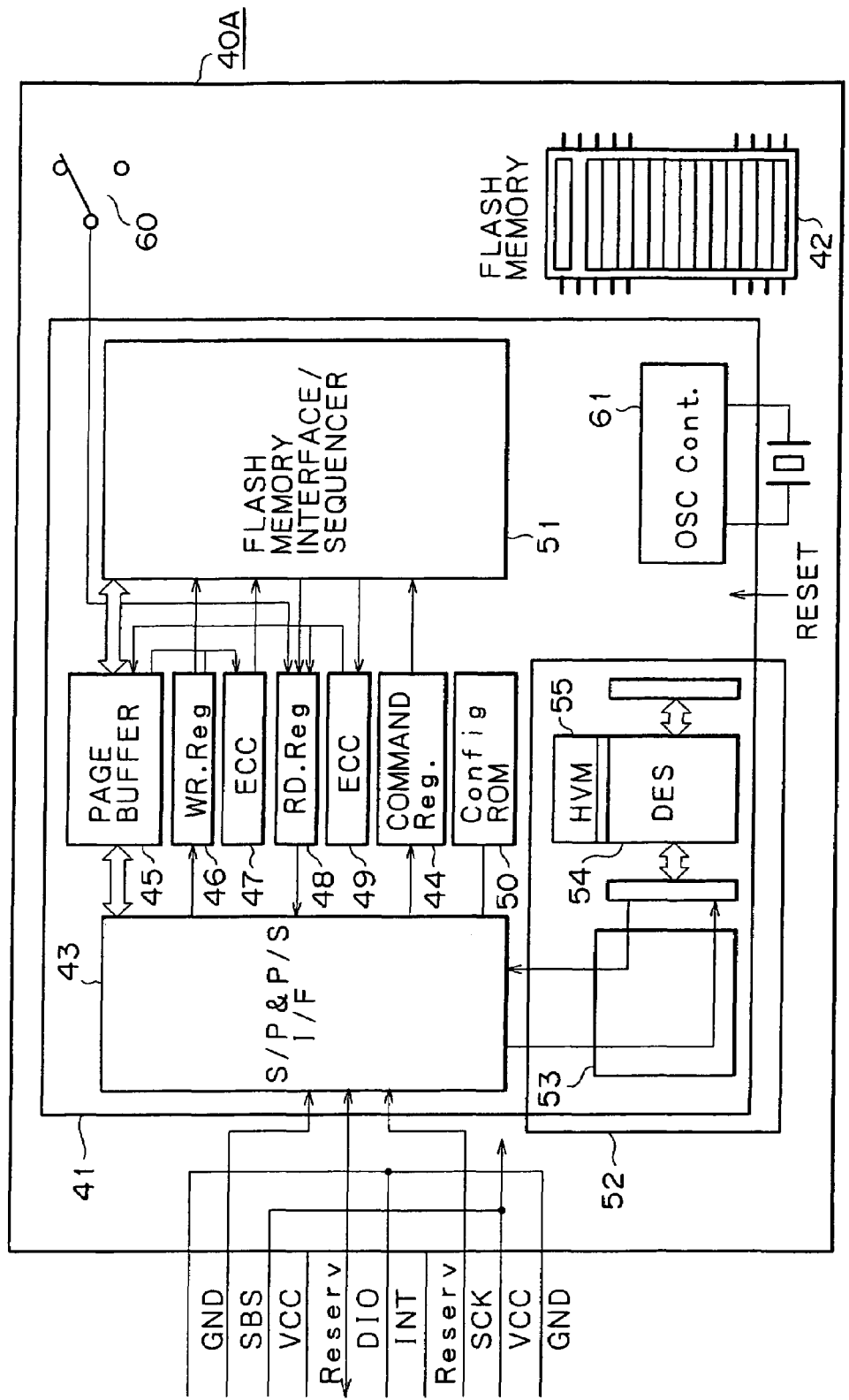
F I G. 2

F I G. 6

| CARD TYPE / MODE | COPYRIGHT-COMPLIANT CARD | COPYRIGHT-NONCOMPLIANT CARD |
|---|---|---|
| DICTATION RECORDING | RECORD MICROPHONE INPUT THROUGH ADPCM | RECORD MICROPHONE INPUT THROUGH ADPCM |
| MUSIC RECORDING | RECORD USB INPUT THROUGH ATRAC3 | RECORD USB INPUT THROUGH ADPCM |

F I G. 9

| CARD TYPE / MODE | COPYRIGHT-COMPLIANT CARD | COPYRIGHT-NONCOMPLIANT CARD |
|---|---|---|
| DICTATION RECORDING | RECORD MICROPHONE INPUT THROUGH ADPCM | RECORD MICROPHONE INPUT THROUGH ADPCM |
| MUSIC RECORDING | RECORD USB INPUT IN ATRAC3 STEREO MODE | RECORD USB INPUT IN ATRAC3 MONAURAL MODE |

TERMINAL APPARATUS

BACKGROUND OF THE INVENTION

The present invention relates to a terminal apparatus capable of selectively accommodating illustratively either a copyright-compliant or copyright-noncompliant memory.

Today, there is a widespread practice of people gaining access through their PCs (personal computers) to desired servers on the WWW (Word Wide Web) network in order to download from there compressed digital data such as pieces of music or images to hard discs of the PCs for private entertainment.

Another practice becoming popular today involves furnishing a portable terminal apparatus with a portable memory (e.g., memory card) which incorporates a nonvolatile memory such as a flash memory. (A portable terminal apparatus incorporating a fixed nonvolatile memory also applies.) The portable terminal apparatus is connected to the PC via a IEEE 1394-compatible cable or an interface such as RS (Recommended Standard)-232C or USB (Universal Standard Bus). Compressed digital data such as pieces of music and images are transferred or copied from the hard disc drive of the PC to the nonvolatile memory. The portable terminal apparatus accommodating the nonvolatile memory is then carried by users to enjoy recorded music or other contents illustratively in outdoor situations.

There has been a trend where digital data downloaded via the Internet are illegally copied and distributed because copyright controls implemented through encryption and/or authorization are yet to be strictly enforced.

At present, digital data stored in the nonvolatile memories mentioned above are not encrypted. It has been concerned that illegal copies can drown the legitimate market by way of systems using the above-described portable terminal apparatus.

With a view to enforcing stricter copyright controls, nonvolatile memories incorporating a signal processing circuit for authorization and encryption have been proposed. The memories thus developed are copyright-compliant nonvolatile memories (copyright-compliant memory cards).

When the proposed copyright-compliant nonvolatile memories are promoted for widespread use, it is necessary to distinguish them clearly from the currently employed copyright-noncompliant nonvolatile memories so that users may selectively utilize one or the other type of memories depending on the situation.

Meanwhile, compatibility with existing portable devices requires that the copyright-compliant nonvolatile memories must not have an external shape different from that of the conventional nonvolatile memories. In other words, both the copyright-noncompliant and the copyright-compliant nonvolatile memories have the same shape so as to be accommodated into portable terminal apparatuses.

The copyright-noncompliant nonvolatile memories are used illustratively to record what may be called copyright-free digital data such as privately recorded voice and images of conference proceedings.

On the other hand, the copyright-compliant nonvolatile memories are used to record digital data (e.g., pieces of music) from existing storage media such as CD (compact disc) and MD (mini-disc). With these memories, illegal copies of copyright-protected data are prevented through encryption or by a suitable authorization process.

For copyright protection, the copyright-compliant nonvolatile memories must incorporate a signal processing circuit for authorization or encryption, a feature not included in the copyright-noncompliant nonvolatile memories.

There are two major types of terminal apparatuses. One type of portable terminal apparatus is capable of recording primarily conference proceedings (microphone input-dedicated terminal apparatus), and another type of portable terminal apparatus can download encrypted digital data (e.g., music data) from the PC or like sources (line input-dedicated terminal apparatus).

A third type of portable terminal apparatus is conceivable, one that is capable both of recording conference proceedings and like dictations and of downloading digital data such as music data (microphone input/line input-compatible terminal apparatus).

In this specification, the term "microphone input" refers to the input of analog audio signals through a microphone that may be either connected to the portable terminal apparatus or incorporated in the apparatus. The term "line input" signifies the input illustratively of digital audio data through an optical cable or of other data through a cable that complies with USB, IEEE 1394, RS232C or other standards.

The microphone input-dedicated terminal apparatus should be loaded with a copyright-noncompliant nonvolatile memory, while the line input-dedicated terminal apparatus for downloading data from the PC or the like should have a copyright-compliant nonvolatile memory inserted therein.

In addition, the microphone input/line input-compatible terminal apparatus should be furnished selectively with either a copyright-compliant or with a copyright-noncompliant memory depending on the intended use, i.e., microphone or line input recording.

As mentioned above, the copyright-noncompliant and -compliant nonvolatile memories both have substantially the same shape, which makes it difficult for general users to distinguish the two types of memories. In addition, not all users are aware of which portable terminal apparatus is supposed to be compatible with which type of nonvolatile memory.

Inadvertent loading of an inappropriate type of nonvolatile memory into the portable terminal apparatus is bound to occur frequently, given the difficulty of distinguishing the different types of nonvolatile memories, lack of understanding on the part of users about compatibility between portable terminal apparatuses and nonvolatile memories, and unrealistic expectations that users will always employ an appropriate type of memory depending on the situation of utilization. Use of an improper type of memory can entail inadequate recording or reproduction of data by the portable terminal apparatus.

Such inappropriate execution of recording or reproduction will lead to inadequate implementation of copyright protection.

In particular, the microphone input/line input-compatible terminal apparatus equipped with a copyright-noncompliant nonvolatile memory will pose a problem when a user completes a required billing process before downloading data over a network for recording purposes. In that case, the terminal apparatus inhibits data recording to the copyright-noncompliant nonvolatile memory while contents to be recorded are being distributed over the network. That is, the user cannot get the distributed contents recorded by operation of the apparatus, or leaves the apparatus to take care of the recording of downloaded data, only to find later that the recording has not been made. Once the user completes the billing process, the relevant contents are transmitted to the user from a server over the network without interruption.

Although the user has already paid for the contents, the data cannot be recorded when transmitted continuously because of memory incompatibility.

SUMMARY OF THE INVENTION

The present invention has been made in view of the above circumstances and provides a terminal apparatus which, if furnished by the user with an improper type of memory for data recording, still allows data to be recorded to the memory at a lowered level of data quality for copyright protection so as to avert confusion and inconveniences on the part of the user such as inoperativeness mistaken for a system defect or an outright mechanical failure to record the necessary data.

In carrying out the invention and according to one aspect thereof, there is provided a terminal apparatus into which any one of a first and a second memory card is selectively inserted, the first memory card carrying a signal processing circuit for copyright protection, the second memory card not carrying a signal processing circuit for copyright protection, the terminal apparatus comprising: compression processing means for applying a second compression process to an input first compressed signal having undergone a first compression process, the second compression process being inferior to the first compression process in terms of compression efficiency; selecting means for selecting either the first compressed signal having undergone the first compression process, or a second compressed signal furnished by the compression processing means; judging means for judging whether a memory card inserted into the terminal apparatus is the first memory card or the second memory card; controlling means for controlling the selecting means in accordance with a judgment made by the judging means; and recording means for recording the compressed signal selected by the controlling means to the inserted memory card.

According to another aspect of the invention, there is provided a terminal apparatus into which any one of a first and a second memory card is selectively inserted, the first memory card carrying a signal processing circuit for copyright protection, the second memory card not carrying a signal processing circuit for copyright protection, the terminal apparatus comprising: a first input terminal through which to input an analog audio signal picked up by a microphone; a second input terminal through which to input a digital audio compressed signal having undergone a first compression process; decompressing means for decompressing the digital audio compressed signal input through the second input terminal; D/A converting means for converting a decompressed digital audio signal from the decompressing means into an analog audio signal; first switching means for selecting either an analog audio signal which, having being picked up by the microphone, is input through the first input terminal, or the converted analog audio signal from the D/A converting means; A/D converting means for converting the selected analog audio signal from the first switching means into a digital audio signal; compression processing means for subjecting the converted digital audio signal from the A/D converting means to a second compression process which is different from the first compression process; second switching means for selecting either a digital audio compressed signal which, having undergone the first compression process, is input through the second input terminal, or a digital audio compressed signal which, having undergone the second compression process, is output from the compression processing means; judging means for judging whether a memory card inserted into the terminal apparatus is the first memory card or the second memory card; controlling means for controlling the first and the second switching means in accordance with a judgment made by the judging means; and recording means for recording the digital audio compressed signal selected by the second switching means to the inserted memory card.

According to a further aspect of the invention, there is provided a terminal apparatus into which any one of a first and a second memory card is selectively inserted, the first memory card carrying a signal processing circuit for copyright protection, the second memory card not carrying a signal processing circuit for copyright protection, the terminal apparatus comprising: converting means for converting an m-channel audio signal, m being an integer of at least 2, into an n-channel audio signal, n being a positive integer not greater than m; selecting means for selecting either an input m-channel audio signal or the converted n-channel audio signal from the converting means; judging means for judging whether a memory card inserted into the terminal apparatus is the first memory card or the second memory card; controlling means for controlling the selecting means in accordance with a judgment made by the judging means; and recording means for recording the audio signal selected by the controlling means to the inserted memory card.

According to an even further aspect of the invention, there is provided a terminal apparatus into which any one of a first and a second memory card is selectively inserted, the first memory card carrying a signal processing circuit for copyright protection, the second memory card not carrying a signal processing circuit for copyright protection, the terminal apparatus comprising: microphone inputting means for inputting an analog audio signal picked up by a microphone; converting means for converting a line input m-channel digital audio signal, m being an integer of at least 2, into an n-channel digital audio signal, n being a positive integer not greater than m; selecting means for selecting either the line input m-channel digital audio signal or the converted n-channel digital audio signal from the converting means; operating means for setting either a digital audio signal recording mode in which to record the line input m-channel digital audio signal, or an analog audio signal recording mode in which to record the analog audio signal input by the microphone inputting means; judging means for judging whether a memory card inserted into the terminal apparatus is the first memory card or the second memory card; controlling means for controlling the selecting means in accordance with a judgment made by the judging means and with the mode set by the operating means; and recording means for recording the audio signal selected by the controlling means to the inserted memory card.

Other objects, features and advantages of the invention will become more apparent upon a reading of the following description and appended drawings.

BRIEF DESCRIPTION OF THE DRAWINGS

FIG. 2 is a block diagram of a copyright-compliant memory card applicable to the invention;

FIG. 6 is a table of correspondence between selectable recording modes and the copyright-compliant or copyright-noncompliant memory card that is inserted into the apparatus;

FIG. 9 is a table of correspondence between selectable recording modes and the copyright-compliant or copyright-noncompliant memory card that is inserted into the apparatus.

DETAILED DESCRIPTION OF THE PREFERRED EMBODIMENTS

Preferred embodiments of this invention will now be described. The invention is embodied illustratively as a portable device that utilizes a flash memory-loaded memory card as a detachable storage medium. The portable device is illustratively an apparatus for recording and reproducing digital audio signals and other data. This portable device may be called simply recorders hereunder.

The preferred embodiments to be described use one of two types of memory card: a copyright-compliant memory card 40A having a security function for copyright protection, or a copyright-noncompliant memory card 40B having no security function for copyright protection. Each of these cards will be described later in detail.

Figure 1:
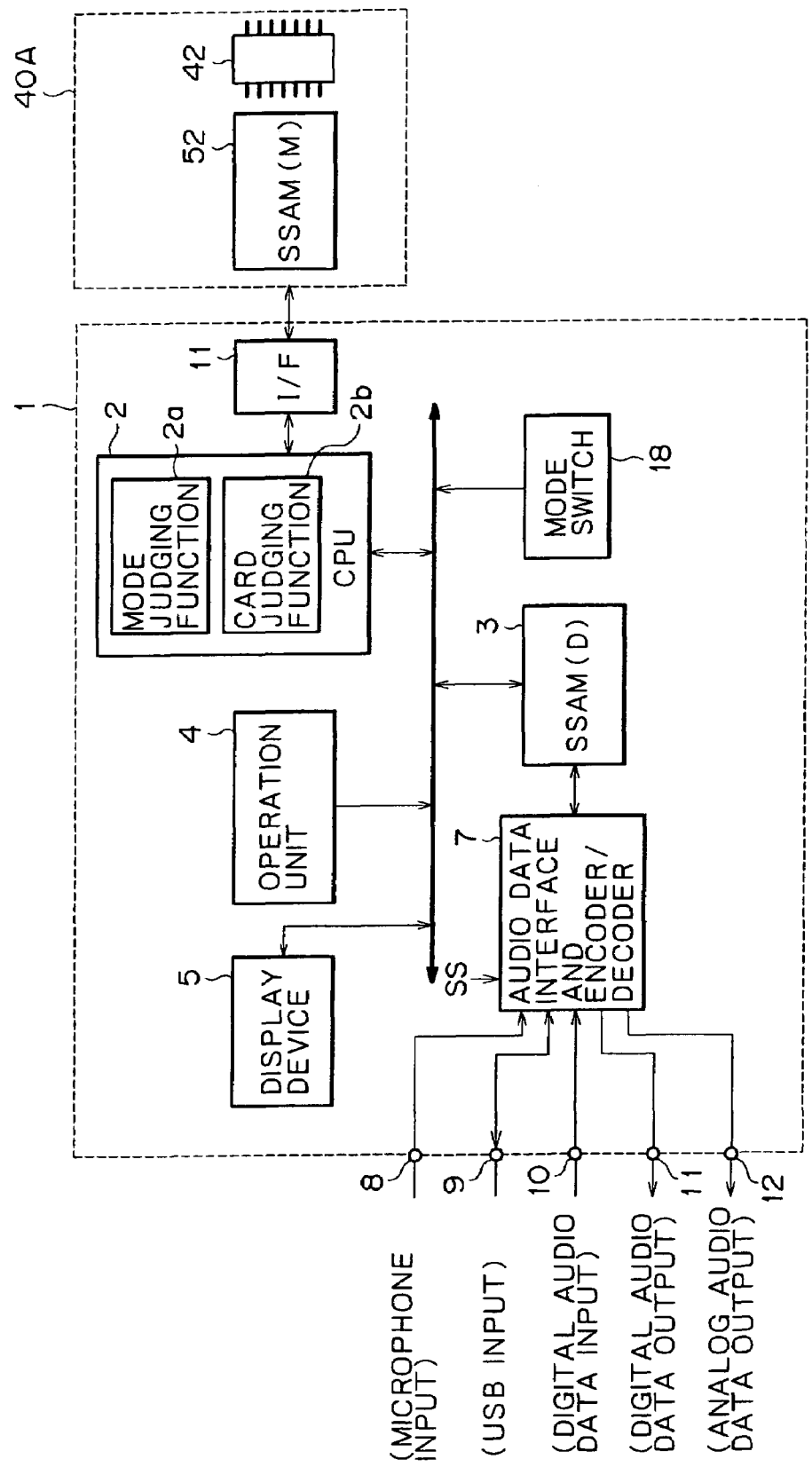
FIG. 1 is a block diagram of a memory recording and reproducing apparatus applicable to the invention.

FIG. 1 is a block diagram of a portable device (recorder 1) with the memory card 40A inserted into the recorder as a storage medium.

In FIG. 1, broken lines enclose two major blocks, one block depicting how the recorder 1 is constituted, the other block showing how the memory card 40A is structured. The memory card 40A is loaded into the recorder 1 in a freely detachable manner.

The recorder 1 and the memory card 40A (and 40B, to be described later) constitute a recording and reproducing system. This system is capable of recording and reproducing not only digital audio signals but also moving and still picture data.

The recorder 1 comprises a CPU 2, a security block 3 connected to the CPU 2 through a bus, an operation unit 4, and a display device 5.

The security block 3 includes a DES (Data Encryption Standard) encryption circuit and a circuit for performing an authorization process.

The operation unit 4 has keys, buttons, a jog dial and other controls which allow users to carry out various operations regarding recording and reproduction.

Operation information such as a recording or playback command generated in response to a user operation on the operation unit 4 is sent to the CPU 2 over the bus.

The display device 5 is illustratively constituted by a liquid crystal display panel. Under control of the CPU 2, the display device 5 displays various items of information and an operation status of the recorder 1.

The recorder 1 is also furnished with a mode switch 18. The mode switch 18 is operated to set one of two modes: a microphone input mode in which dictations such as conference proceedings are recorded through a microphone connected by a user, and a line input mode in which audio signals (i.e., music) supplied as a line input are recorded. The term "line input" refers to a data input effected through a terminal 9 acting as a USB connecter (to be described later), or to a data input through an optical cable terminal 10 compatible with digital audio input.

The CPU 2 performs various controls by supplying control signals to different parts of the system over the bus. In addition to its functions for controlling recording and reproducing operations, the CPU 2 has a mode judging function 2a and a card judging function 2b, as shown in FIG. 1.

The mode judging function 2a judges the operated state of the mode switch 18. Depending on how the mode switch 18 is judged to be operated, the mode judging function 2a sets either the microphone input mode or the line input mode.

The card judging function 2b judges whether the inserted memory card is the copyright-compliant memory card 40A (having the security function) or the copyright- noncompliant card 40B, to be described later.

The recorder 1 further includes an audio data interface and encoder/decoder portion 7 (called the encoder/decoder hereunder).

A structure and operations of the encoder/decoder 7 will be described later in detail with reference to FIG. 4. Disposed between the recorder 1 and an externally furnished device, the encoder/decoder 7 provides an I/O interface of audio signals, various encoding and decoding processes, A/D and D/A conversion, and I/O switching processes.

Terminals 8 through 12 are provided to handle audio signal input and output to and from the recorder 1. The input and output of audio signals through these terminals and the concomitant signal processes are carried out by the encoder/decoder 7.

The terminal 8 is connected to a microphone and admits a voice signal as a microphone input. Illustratively, the terminal 8 allows the recorder 1 to record conference proceedings and other dictations.

The terminal 9 acts as a USB connector terminal used illustratively to perform digital data communication with an external data processing device such as a personal computer. In this example, compressed data are input from an external personal computer through the terminal 9. the compressed audio data entered through the terminal 9 may be written to the memory card 40A or 40B, as will be described later. Audio data retrieved from the memory card 40A or 40B may be output to an external device such as the personal computer through the terminal 9.

The terminal 10 is an optical cable-compatible terminal through which to input an audio signal in the form of digital data from an external audio output device such as the CD player or MD (mini-disc) player reproducing recordings from their respective media.

The terminal 11 is an optical cable-compatible terminal through which to output an audio signal in the form of digital data from an external audio output device such as the MD (mini-disc) player reproducing recordings from their respective media.

The terminal 12 is an analog audio signal output terminal. An analog audio signal is output through the terminal 12 to an external audio output device such as the MD recorder or tape recorder.

Data are recorded to the memory card 40A (or 40B) as follows: an audio signal supplied through the terminal 8, 9 or 10 is subjected to various processes, to be described later, performed by the encoder/decoder 7 before the processed data are supplied to the security block 3.

The security block 3 encrypts the processed data supplied. In some cases, no encryption process will be carried out by he security block 3, as will be discussed later in connection with the encoder/decoder 7.

The security block 3 and a security block 52, to be described later, in the memory card 40A are provided so as to protect the copyright of contents (digital audio signal in this example). The security block 3 in the recorder 1 has a plurality of master keys and a storage key that is unique to the device in question. These keys are used for encryption and decryption purposes.

The security block 3 also includes a randomize circuit that generates session keys. When the memory card 40A incorporating the security block 52 is inserted into the recorder 1, an authorization process is carried out to see if the inserted memory card 40A is an authorized card. If the memory card 40A is judged to be authentic, the security block 3 may then share a session key with the security block 52.

The security blocks 3 and 52 are each equipped with a function for executing a suitable authorization process.

As will be described later in more detail, the memory card 40A is a single-chip IC card that carries a flash memory (nonvolatile memory) 42, a security block 52 including a DES encryption circuit, a communication interface, and registers.

The memory card 40A is loaded into the recorder 1 in a freely detachable fashion. In practice, the recorder 1 is capable of accommodating a memory card without encryption functions, i.e., a memory card 40B (to be described later) having no security block.

When input as described above, the audio data are processed by the encoder/decoder 7 and by the security block 3. The audio data thus processed are sent to the CPU 2.

The CPU 2 communicates data through a memory interface 11 with the memory card 40A fastened to a detachable mechanism, not shown. The memory interface 11 ensures serial data communication between the CPU 2 and the memory card 40A.

After being encrypted by the security block 3, the audio data are sent by the CPU 2 to the memory card 40A by way of the memory interface 11. The audio data fed to the memory card 40A are written to the flash memory 42 located therein.

The input audio signal is routed as described above before being recorded to the memory card 40A.

Audio data are reproduced from the memory card 40A as follows: the CPU 2 reads audio data from the flash memory 42 through the memory interface 11. The retrieved audio data (i.e., encrypted audio data) are sent to the security block 3 for decryption (decryption is not needed in some cases, as will be described later). The decrypted audio data are then suitably processed by the encoder/decoder 7.

The processing by the encoder/decoder 7 produces a 16-bit-per-sample audio signal sampled at 44.1 kHz. This audio signal is output to an external device through the terminal 11.

If the audio data are converted to an analog signal by the encoder/decoder 7, the analog audio signal is output to the external device through the terminal 12.

FIG. 2 is a block diagram of the memory card 40A. The memory card 40A is a single-chip IC card comprising a control block 41 and a flash memory 42.

A bidirectional serial interface (i.e., memory interface 11) between the CPU 2 in the recorder 1 and the memory card 40A is made up of 10 signal lines.

The signal lines include four principal lines: a clock line SCK for sending clock signals during data transmission, a status line SBS for sending status information, a data line DIO for transmitting data, and an interrupt line INT.

Two ground lines GND and two power lines VCC are provided for power supply purposes. The remaining two signal lines (indicated as "Reserv") are reserved.

The clock line SCK is designed to send clock signals in synchronism with data. The status line SBS is intended to transmit a signal indicating the status of the memory card 40A.

The data line DIO is used to input and output commands and encrypted audio data.

The interrupt line INT is a signal line that transmits an interrupt signal allowing the memory card 40A to request an interruption of the CPU 2 in the recorder 1.

The interrupt signal is generated when the memory card 40A is inserted into the recorder 1. With this embodiment, however, the interrupt signal is sent over the data line DIO whereas the interrupt line INT is grounded and not used.

A serial/parallel and parallel/serial conversion interface block 43 (which may be abbreviated to S/P, P/S, I/F block) provides an interface between the control block 41 on the one hand and the memory interface 11 of the recorder 1 connected to the card by means of a plurality of signal lines on the other hand.

The serial/parallel and parallel/serial conversion interface block 43 converts serial data from the recorder 1 into parallel data and feeds the converted parallel data into the control block 41. The interface block 43 also converts parallel data from the control block 41 into serial data and transfers the converted serial data to the recorder 1.

Furthermore, upon receiving commands and data over the data line DIO, the serial/parallel and parallel/serial conversion interface block 43 separates what is received into two groups: commands and data for ordinary access to the flash memory 42 on the one hand, and commands and data requiring encryption on the other hand.

More specifically, a command comes first followed by data in a format in which signals are sent over the data line DIO. The serial/parallel and parallel/serial conversion interface block 43 checks the code of a given command to determine whether the command and the ensuing data are needed for ordinary access or require encryption.

As a result of the check on the command code, any command needed for ordinary access is set to a command register 44 and the accompanying data are set to a page buffer 45 and to a write register 46.

An error correcting code generating circuit 47 is provided in association with the write register 46. The error correcting code generating circuit 47 generates a redundant error correcting code with respect to the data held temporarily in the page buffer 45.

Output data from the command register 44, page buffer 45, write register 46, and error correcting code generating circuit 47 are supplied to a flash memory interface/sequencer 51 (which may be abbreviated to a memory I/F, sequencer).

The flash memory interface/sequencer 51 provides an interface between the control block 41 and the flash memory 42, thus controlling data exchanges therebetween. Data are written to the flash memory 42 through this memory interface/sequencer 51.

In a data read operation, data retrieved from the flash memory 42 are sent through the flash memory interface/sequencer 51 to the page buffer 45, to a read register 48, and to an error correcting circuit 49.

Any error in the data placed in the page buffer 45 is corrected by the error correcting circuit 49. Error-corrected output data from the page buffer 45 as well as output data from the read register 48 are fed to the serial/parallel and parallel/serial conversion interface block 43. From there, the data are sent through the above-mentioned serial interface to the CPU 2 in the recorder 1.

A configuration ROM 50 is provided to accommodate information such as version information about the memory card 40A and various items of attribute information.

The memory card 40A is equipped with a switch 60 that may be operated by the user as needed to prevent inadvertent erasure. When the switch 60 is set to the erase inhibit position, the flash memory 42 is protected against erasure even if a command is sent from the recorder 1 requesting erasure of data in the flash memory 42.

An oscillator 61 generates clock pulses providing a timing reference for processing by the memory card 40A.

The security block 3 in the recorder 1 and the security block 52 in the memory card 40A perform their authorization processes and encrypt the contents (i.e., audio data compressed as per ATRAC3, called ATRAC3 data hereunder) to be written to the flash memory 42 as a measure of copyright protection.

The security block 52 includes a buffer memory 53, a DES encryption circuit 54 and a nonvolatile memory 55.

The security block 52 has a plurality of authorization keys and a storage key that is unique to the memory card in question.

The nonvolatile memory 55 accommodates keys needed for encryption and is thus rendered invisible (i.e., unreadable) from the outside. Illustratively, the storage key is held in the nonvolatile memory 55.

The security block 52 also has a randomize circuit which permits authorization of the dedicated recorder 1 (i.e., a recorder sharing a predetermined data format within the system) sharing a session key with the card.

A content key for encrypting ATRAC3 data is encrypted by use of the session key and is transferred between the recorder 1 and the memory card 40A.

As with the security block 52 in the memory card 40A, the security block 3 in the recorder 1 has its own storage key. Illustratively, when encrypted contents are to be moved from one location to another, the content key is again encrypted using the storage key of the security block 3.

In the above description of the recorder 1 and memory card 40A, the security block 3 in the recorder 1 was shown encrypting and decrypting audio data as they were recorded and reproduced to and from the memory card 40A. Alternatively, such encrypting and decrypting processes may be carried out by the security block 52 in the memory card 40A.

In another alternative, audio data may be encrypted by the security block 3 at the time of recording and decrypted by the security block 52 upon playback. Conversely, audio data may be encrypted by the security block 52 for recording and decrypted by the security block 3 for playback.

In a further alternative, audio data may be encrypted by the two security blocks 3 and 52 upon recording and decrypted by the same two security blocks 52 and 3 at the time of playback.

The security blocks 3 and 52 are designed to have similar encryption functions that permit sharing and exchanges of keys for encryption and decryption between the two blocks. These analogous functions will permit implementation of any one of the audio data encryption/decryption schemes outlined above.

In addition to their encryption and decryption features, The security blocks 3 and 52 have an authorization function each. When the memory card 40A is loaded into the recorder 1, the security blocks 3 and 52 communicate authorization data therebetween. An outcome of the data communication serves as a basis for granting or withholding authorization. If authorization is withheld, the recorder 1 illustratively inhibits recording or reproduction of data to or from the memory card 40A.

More specifically, the authorization process is performed illustratively as follows: when the memory card 40A is inserted into the recorder 1, first authorization data held by the security block 3 in the recorder 1 are sent to the memory card 40A. Given the first authorization data, the security block 52 in the memory card 40A generates corresponding second authorization data in accordance with a predetermined formula. The first authorization is supplemented by the second authorization data before being transferred to the recorder 1.

The recorder 1 grants or withholds authorization by checking to see if the memory card 40A has returned the appropriate second authorization data in response to the first authorization data.

The authorization, encryption and decryption functions outlined above are intended primarily to protect copyrights.

Figure 3:
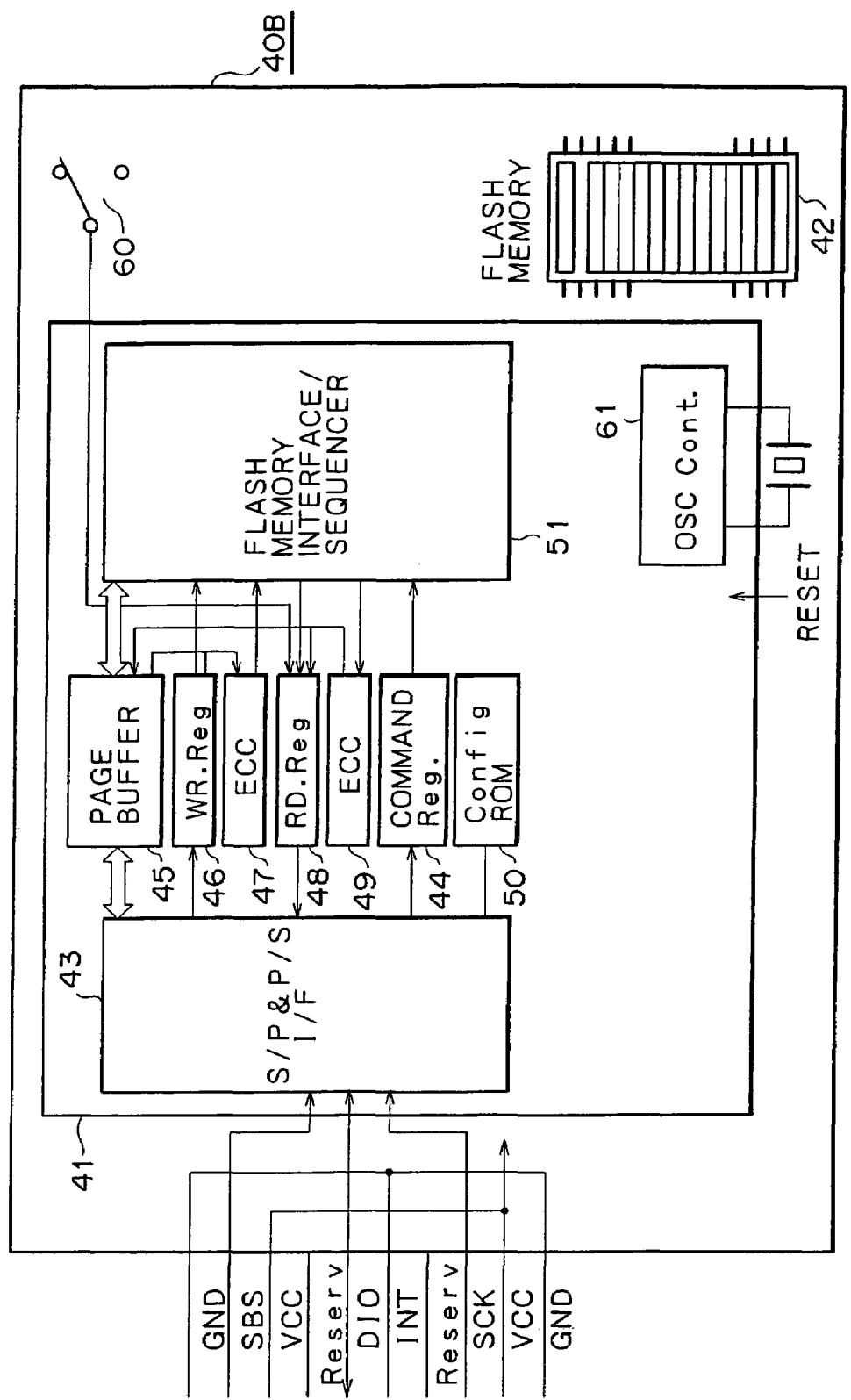
FIG. 3 is a block diagram of a copyright-noncompliant memory card applicable to the invention.

FIG. 3 is a block diagram of the memory card 40B having no encryption feature (i.e., the card is not in compliance with security provisions regarding copyrights). In FIG. 3, those parts with their functionally identical or equivalent counterparts already shown in FIG. 2 are given the same reference numerals, and descriptions of such parts are omitted.

Compared with the memory card 40A described in reference to FIG. 2, the memory card 40B is shown having no security block 52 connected to a serial/parallel and parallel/serial conversion interface block 43. The remaining structural features of the memory card 40B are the same as those of the memory card 40A.

Although not shown, the memory cards 40A and 40B are identical in shape and size.

The recorder 1 accommodates one of two types of memory card: the copyright-compliant memory card 40A, or the copyright-noncompliant memory card 40B.

The memory card 40A is used to record and reproduce primarily data requiring copyright protection such as pieces of music. The memory card 40B is employed to record and reproduce data that need not be copyright-protected such as conference proceedings.

Basically, when recording conference proceedings or other dictations (called dictation recording hereunder), the user inserts the memory card 40B into the recorder 1, operates the mode switch 18 to establish the microphone input mode, and performs a recording start operation.

With the recording started, an audio signal is input through the terminal 8 connected to the microphone. The input audio signal is recorded to the memory card 40B.

When recording pieces of music or other data subject to copyright protection (called music recording hereunder), the user inserts the memory card 40A into the recorder 1, operates the mode switch 18 to set the line input mode, and performs a recording start operation. This allows an audio signal such as music to be input through the terminal 9 or 10. The audio signal thus input is recorded to the memory card 40A.

Users cannot be expected, however, to always insert the correct type of memory card or to set the mode switch appropriately for the intended mode of recording. The memory card 40B may conceivably be inserted for music recording, or the memory car 40A might be attached for dictation recording.

In such cases, it is preferred that the desired data be at least recorded in a way that gives due attention to copyright protection.

In order to make sure that the desired data are at least recorded and to see to it that copyrights are protected at the same time, the encoder/decoder 7 carries out suitable processes as per the mode set by the mode switch 18 under control of the CPU 2 in accordance with the type of the inserted memory card (40A or 40B).

To meet the above requirements entails getting the card judging function 2b of the CPU 2 to determine the type of the inserted memory card.

There are a number of methods by which to judge the type of the inserted memory card.

By one method, the card judging function 2b of the recorder 1 checks the status of response upon authorization.

More specifically, when a memory card is inserted into the recorder 1, the CPU 2 of the recorder 1 transmits first authorization data to the memory card in the manner described above. If the inserted card is the memory card 40B having no security block 52, the CPU 2 fails to receive a normal response (i.e., above-mentioned second authorization data) from the card.

If the CPU 2 does not obtain the normal response within a predetermined period of time following transmission of the first authorization data, the CPU 2 judges that the inserted memory card is the copyright-noncompliant card 40B. If a normal response is acquired within the correct time period, on the other hand, the inserted memory card is judged to be the copyright-compliant memory card 40A.

Another method for determining the card type involves having copyright-compliance/noncompliance identification information stored in a suitable memory card area (i.e., boot area).

When a memory card is inserted into the recorder 1, the CPU 2 retrieves copyright-compliance/noncompliance identification information from data initially read from the boot area of the memory card. On the basis of the identification information thus retrieved, the recorder 1 determines the type of the memory card (as 40A or 40B).

Illustratively, after the CPU 2 (with its card judging function 2b) judges the type of the inserted memory card, with the mode judging function 2a judging the mode selected by the mode switch 18, the CPU 2 causes the encoder/decoder 7 to function accordingly.

How the encoder/decoder 7 is typically structured is described below with reference to FIG. 4.

The terminals 8, 9 and 10 each correspond to a relevant data input stream. The input stream that admits microphone input through the terminal 8 is made up of a microphone amplifier 71, a switch 74, an A/D converter 77, and an ADPCM encoder 76.

An audio signal entered as the microphone input is amplified by the microphone amplifier 71. The amplified signal is transferred through a terminal "c" of the switch 74 to the A/D converter 77 for conversion into digital data. After the conversion, the digital data are subject to ADPCM compression by the ADPCM encoder 76. The audio signal compressed through ADPCM is fed to the security block 3 via a terminal "a" of a switch 75.

Usually, the microphone input audio signal is recorded to the memory card 40B as described above while being exempt from an encryption process. A switch 3c in the security block 3 is thus operated to let the audio signal bypass an encryption block 3a on its way to the CPU 2.

The input stream that admits digital audio data through the terminal 10 connected with an optical cable comprises an ATRAC3 encoder 78.

The ATRAC3 encoder 78 adopts a low bit rate coding method that compresses digital audio signals more efficiently and with higher quality than the ADPCM method.

The low bit rate coding method called ATRAC3 is an improvement over ATRAC (Adaptive Transform Acoustic Coding) used by mini-disc systems. Under ATRAC3, 16-bit-per-sample audio data sampled at 44.1 kHz are processed. The minimum data increment for audio data processing under ATRAC3 is called a sound unit (SU). One sound unit, lasting about 2.3 ms., is composed of 1,024 samples of data (1,024×16 bits×2 channels) compressed into several hundred bytes of data. According to ATRAC3, audio data are compressed into about one-tenth of their original volume. There is little deterioration of sound quality resulting from the data compression or decompression process.

The audio signal compressed by the ATRAC3 encoder 78 is supplied to the security block 3. In the security block 3, the audio signal is encrypted by the encryption block 3a before being sent to the CPU 2.

Input data admitted through the terminal 9 acting as a USB connector include digital audio signals such as pieces of music supplied illustratively from the personal computer as mentioned above. Such digital audio signals have undergone ATRAC3 compression and encryption.

The personal computer carries software that ensures compatibility with the system of the recorder 1. The software allows ATRAC3-compressed and encrypted audio data to be transferred to the recorder 1 for recording to the memory card 40A. This makes it possible illustratively for audio data as desired contents to be copied or relocated with high quality to the memory card.

In that case, there is no need for the encoder/decoder 7 to carry out an ATRAC3 compression process or for the security block 3 to perform an encryption process. Thus the input data through the terminal 9 are fed to the security block 3 via a terminal "b" of the switch 75. The switch 3c in the security block 3 is operated to let the input data bypass the encryption block 3a on their way to the CPU 2.

The input stream associated with the terminal 9 also includes an ATRAC3 decoder 72 and a D/A converter 73. The ATRAC3 decoder 72 performs decryption and decompression processes on ATRAC3-processed data. The data thus decoded are converted by the D/A converter 73 into an analog audio signal. In this manner, the ATRAC3-compressed and encrypted audio data supplied from an external personal computer or like source are turned into an analog audio signal that is forwarded to a terminal "d" of the switch 74.

When the switch 74 is connected to its terminal "d," the analog audio signal are converted to digital data by the A/D converter 77. The digital data are then subject to ADPCM compression by the ADPCM encoder 76.

The switches 74 and 75 have their connecting terminals switched over in accordance with a control signal SS from the CPU 2.

A data output stream is made up of an ATRAC3 decoder 83, an ADPCM decoder 79, switches 80 and 81, and a D/A converter 82. This output stream handles signals that are reproduced from the memory card 40A (or 40B) and transferred from the CPU 2 via the security block 3.

In the security block 3, the data coming from the CPU 2 are routed in one of two ways depending on whether or not the data have been encrypted. That is, a switch 3d is operated either to feed the data through a decryption block 3b or to let the data bypass the decryption block 3b.

In this example, encrypted data held in the memory card 40A have been encoded through ATRAC3. When reproduced and transferred by the CPU 2, such data are decrypted by the decryption block 3b before being sent to the ATRAC3 decoder 83.

Figure 4:
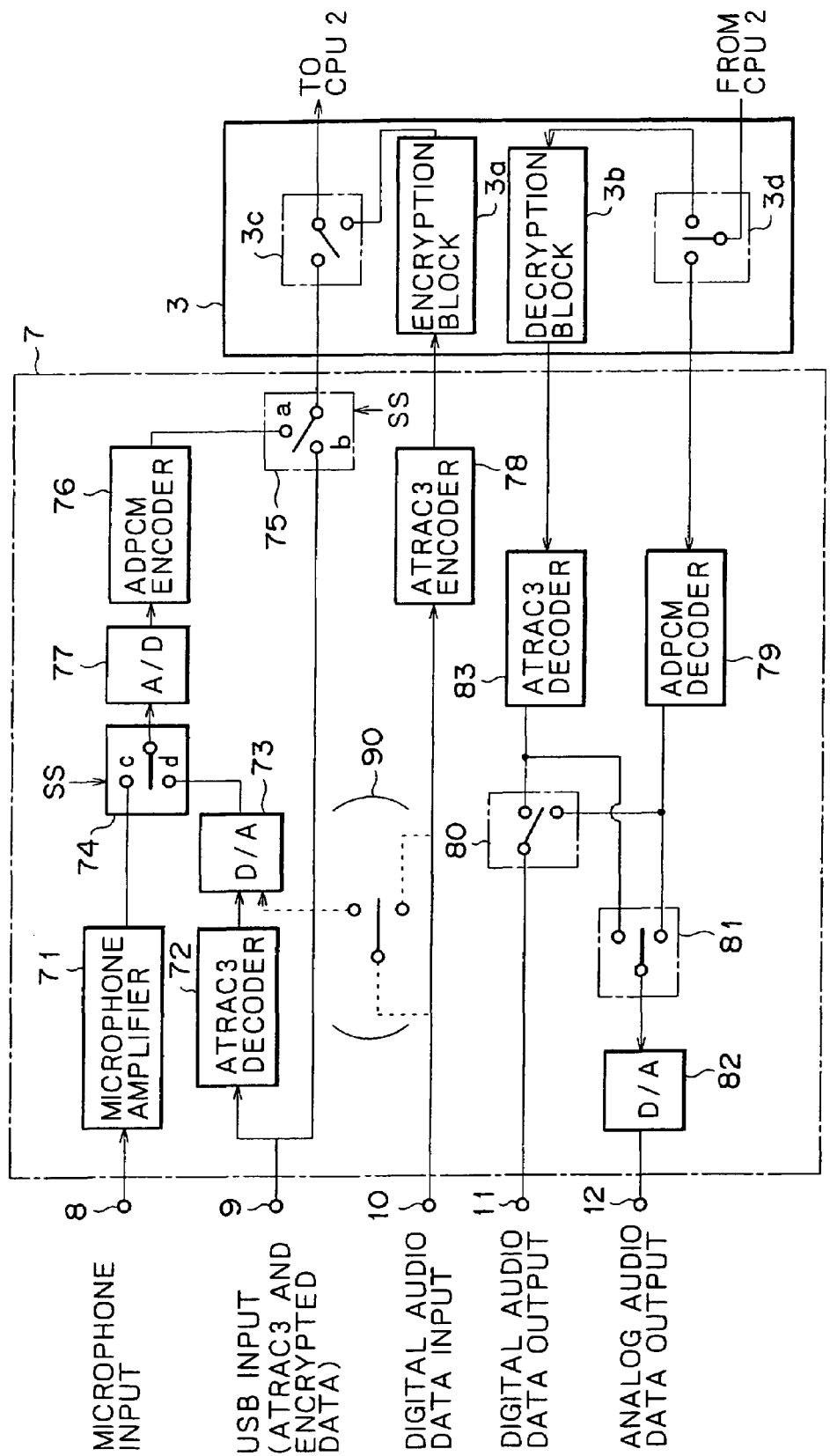
FIG. 4 is a block diagram of a memory recording and reproducing apparatus applicable to a first processing example of the invention.

Although shown discretely in FIG. 4, the ATRAC3 decoder 72 and ATRAC decoder 83 may be constituted by an integral component.

The ATRAC3 decoder 83 produces a 16-bit-per-sample audio signal sampled at 44.1 kHz. This audio signal is sent through the switch 80 to the terminal 12 for output as digital audio data.

Alternatively, the 16-bit-per-sample audio signal sampled at 44.1 kHz from the ATRAC3 decoder 83 is fed through the switch 81 to the D/A converter 82 for conversion into an analog audio signal. After the conversion, the analog audio signal is output through the terminal 12 to an external device.

Data held in the memory card 40B have not been encrypted. As will be described later, data to be recorded to the memory card 40A may not be encrypted in some cases. If such encryption-free data are reproduced, the data transferred from the CPU 2 are sent through the switch 3d to the ADPCM decoder 79.

The ADPCM decoder 79 turns the received data into a 16-bit-per-sample audio signal sampled at 44.1 kHz. This audio signal is sent through the switch 80 to the terminal 12 for output to an external device.

Alternatively, the 16-bit-per-sample audio signal sampled at 44.1 kHz from the ADPCM decoder 79 is fed through the switch 81 to the D/A converter 82 for conversion into an analog audio signal. The analog audio signal after conversion is output through the terminal 12 to an external device.

The foregoing description has shown how the encoder/decoder 7 is typically structured. When an audio signal entered through the terminal 8, 9 or 10 is to be recorded to a memory card, the CPU 2 controls the switches 74 and 75 as outlined in FIG. 5 depending on the input mode and on the type of the inserted memory card judged as described above.

For purpose of illustration, the description that follows will center on how inputs are made through the terminals 8 and 9. The input through the terminal 10 will be described later only briefly.

Figure 5:
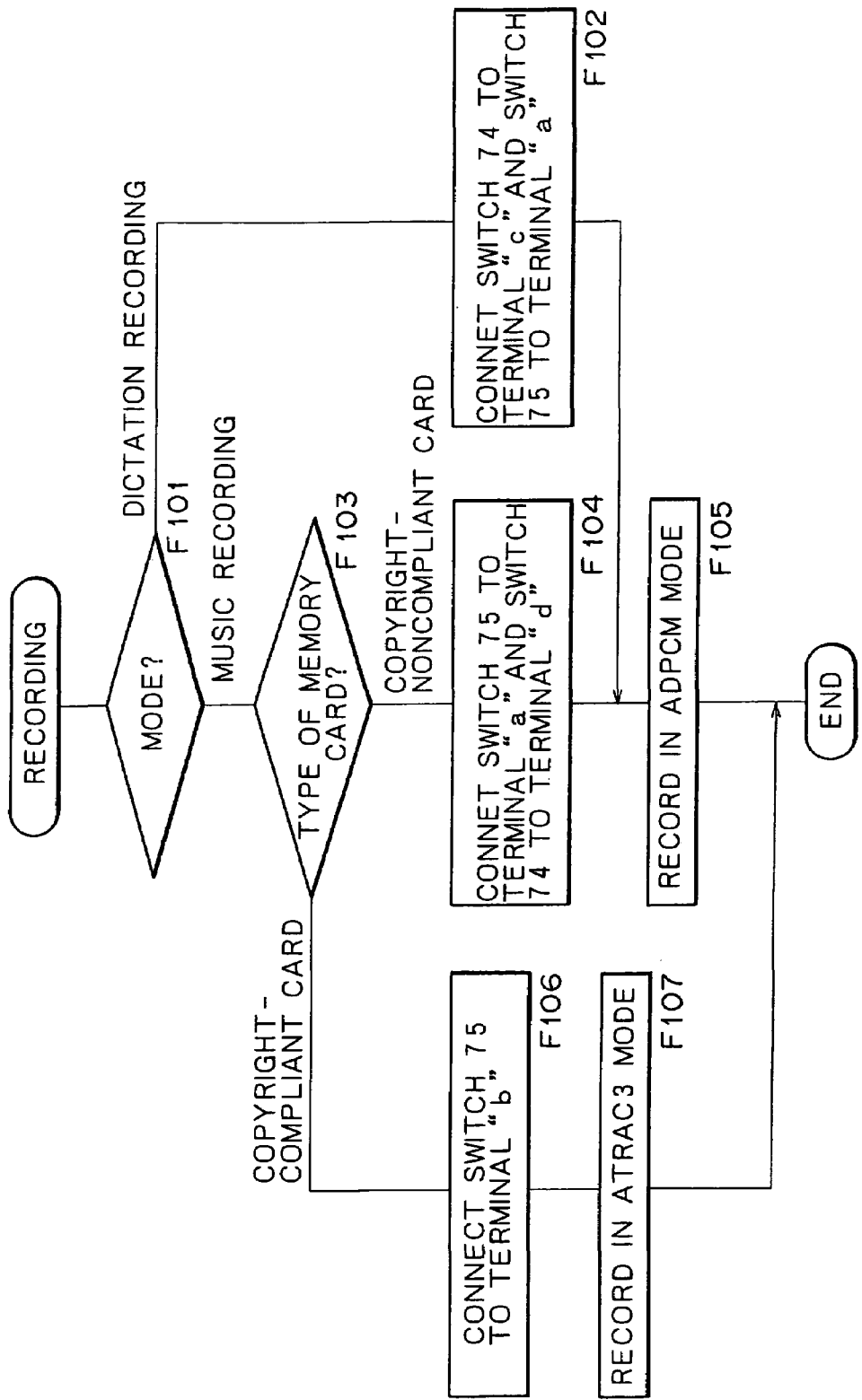
FIG. 5 is a flowchart of steps constituting the first processing example performed when the copyright-compliant or copyright-noncompliant memory card is inserted into the memory recording and reproducing apparatus.

At the time of recording, the CPU 2 operates as follows: in step F101 of FIG. 5, the mode judging function 2a of the CPU 2 judges the mode set by operation of the mode switch 18.

If the microphone input mode is judged to be set by the mode switch 18 (i.e., for dictation recording), step F102 is reached in which the CPU 2 connects the switch 74 to its terminal "c" and the switch 75 to its terminal "a." At this point, the switch 3c is operated in the security block 3 for the flow of data to bypass the encryption block 3a.

The switch settings above complete an input stream in which an audio signal picked up by the microphone is moved from the terminal 8 to the CPU 2 after passing through the microphone amplifier 71, A/D converter 77 and ADPCM encoder 76, in that order. The microphone input audio signal is thus recorded in ADPCM mode in step F105. That is, the signal undergoes ADPCM compression but is not subject to encryption before being recorded to the memory card.

In the case above, the memory card 40B should be used as a rule but the memory card 40A may also be employed for dictation recording. That is, data are still recorded even if the user inadvertently inserts the memory card 40A (or intentionally when, say, a memory card 40B is not on hand).

When the microphone input mode is in effect, the settings of the switches 74 and 75 disable recording of data through the terminal 9. That is, music data requiring copyright protection will not be admitted through the terminal 9 for recording to the inserted memory card in the microphone input mode.

If in step F101 the line input mode is judged to be in effect, i.e., if the user wants recording of music through a data copy or relocation from the personal computer, then the CPU 2 goes to step F103. In step F103, the card judging function 2b judges the type of the inserted memory card.

If the inserted memory card is judged to be the copyright-compliant memory card 40A, step F106 is reached. In step F106, the switch 75 is connected to its terminal "b."

The setting of the switch 75 completes an input stream in which the audio signal entered through the terminal 9 acting as a USB connector (i.e., the signal is made of audio data having undergone ATRAC3 encoding and encryption) is forwarded to the CPU 2. The audio data supplied by the personal computer or the like are thus recorded in ATRAC3 mode in step F107. That is, the audio data having undergone ATRAC3 encoding and encryption are recorded to the memory card 40A.

When the line input mode is established with a view to copying or moving music data from the personal computer, the user may inadvertently insert the copyright-noncompliant memory card 40B. In that case, attempts to copy or move the data will disable authorization processes between the recorder 1 and the memory card 40B and may sometimes lead to a violation of copyrights. On the other hand, an outright prohibition of data recording will be a disservice to well-meaning users.

With such circumstances taken into consideration, if the inserted memory card is judged to be the copyright-non-compliant memory card 40B in step F103, the CPU 2 goes to step F104. In step F104, the CPU 2 connects the switch 74 to its terminal "d" and the switch 75 to its terminal "a."

The switch settings above complete an input stream in which the audio signal entered through the terminal 9 acting as a USB connector (i.e., the signal is made of audio data having undergone ATRAC3 encoding and encryption) is forwarded to the CPU 2 after passing through the ATRAC3 decoder 72, D/A converter 73, A/D converter 77 and ADPCM encoder 76, in that order.

In other words, the ATRAC3-encoded and encrypted audio data are reverted temporarily to an analog signal before being converted again to digital data. The digital data are then encoded through ADPCM.

Through the above input stream, the data are recorded in step F105 in ADPCM mode. That is, the ATRAC3-encoded and encrypted audio data are converted back to an analog signal that is subjected to ADPCM compression but not to encryption. The ADPCM-compressed data are recorded to the memory card.

The process above means the data are recorded at a lowered level of quality to the memory card 40B, With signal quality deliberately reduced, the recorded data are sufficient for the user's private use but are not germane to intentional violations of copyrights. The diminished quality of the data lowers their values for eventual distribution to third parties, thereby discouraging copyright violations through the abuse of the memory card 40B.

The recording operations discussed above are summarized in the table of FIG. 6.

In the microphone input mode (for dictation recording), the microphone input audio signal entered through the terminal 8 is recorded in ADPCM mode regardless of the type of the inserted memory card.

In the line input mode (for music recording), if the copyright-compliant memory card 40A is judged to be inserted, a USB data transfer admitted through the terminal 9 is recorded in ATRAC3 mode, i.e., with high quality. If the copyright-noncompliant memory card 40B is judged to be inserted, the USB data transfer input through the terminal 9 is recorded in ADPCM mode, i.e., after being converted to lower-quality data.

A digital audio signal entered through the terminal 10 is forwarded illustratively through a switch 90 shown by broken lines in FIG. 4. Suitably setting the switch 90 permits recording of data in accordance with the judged type of the inserted memory card, as in the case of the USB input.

More specifically, if the memory card 40A is judged to be inserted, the digital audio signal entered through the terminal 10 is subject to ATRAC3 compression by the ATRAC3 encoder 78 and then to encryption by the encryption block 3a in the security block 3. The signal thus processed is recorded to the memory card 40A.

If the memory card 40B is judged to be inserted, the digital audio signal input through the terminal 10 is converted to an analog signal by the D/A converter 73. The analog signal is fed to the A/D converter 77 for conversion to digital data and then to the ADPCM encoder 76 for ADPCM compression. The compressed data are then recorded without encryption to the memory card 40B.

Alternatively, the digital audio signal entered through the terminal 10 may be arranged to be barred from being recorded if anything other than the memory card 40A is found inserted, e.g., if the presence of the memory card 40B deters authorization or encryption processes.

In the examples above, ATRAC3 was adopted as the high signal quality compression method and ADPCM as the low signal quality compression method. Alternatively, other methods may be utilized for high quality data compression, such as MPEG, TWIN-VQ, EPAC, AAC (Advanced Acoustic Coding) Real Audio, MS-Audio, or AC-3. An alternative method for low quality data compression may be DPCM or any one of the above-mentioned schemes with its compression rate suitably lowered.

Furthermore, although the foregoing description centered primarily on the compression of audio signals, this is not limitative of the invention. The invention may also be adapted to handle still pictures and moving pictures.

Where still picture or moving picture data are involved, BMP (bit map) or HD (High-Definition) may be adopted as the method for high quality compression, and GIF, JPEG or SD (Standard Definition) may be used for low quality compression.

In the configuration example of FIG. 4, the high-quality ATRAC3 signal was shown converted to the low-quality ADPCM signal. Alternatively, the order of the signal conversion may be reversed.

In the processing example above, the quality of recorded data was shown varied by altering the target data compression rate depending on whether the copyright-compliant memory card 40A or copyright-noncompliant memory card 40B is being inserted. In an alternative example, a stereo audio signal may be recorded to the copyright-compliant memory card 40A while a monaural audio signal is recorded to the copyright-noncompliant memory card 40B.

How stereo and monaural audio signals are recorded to the different memory cards will now be described in reference to FIGS. 7 through 9.

Figure 7:
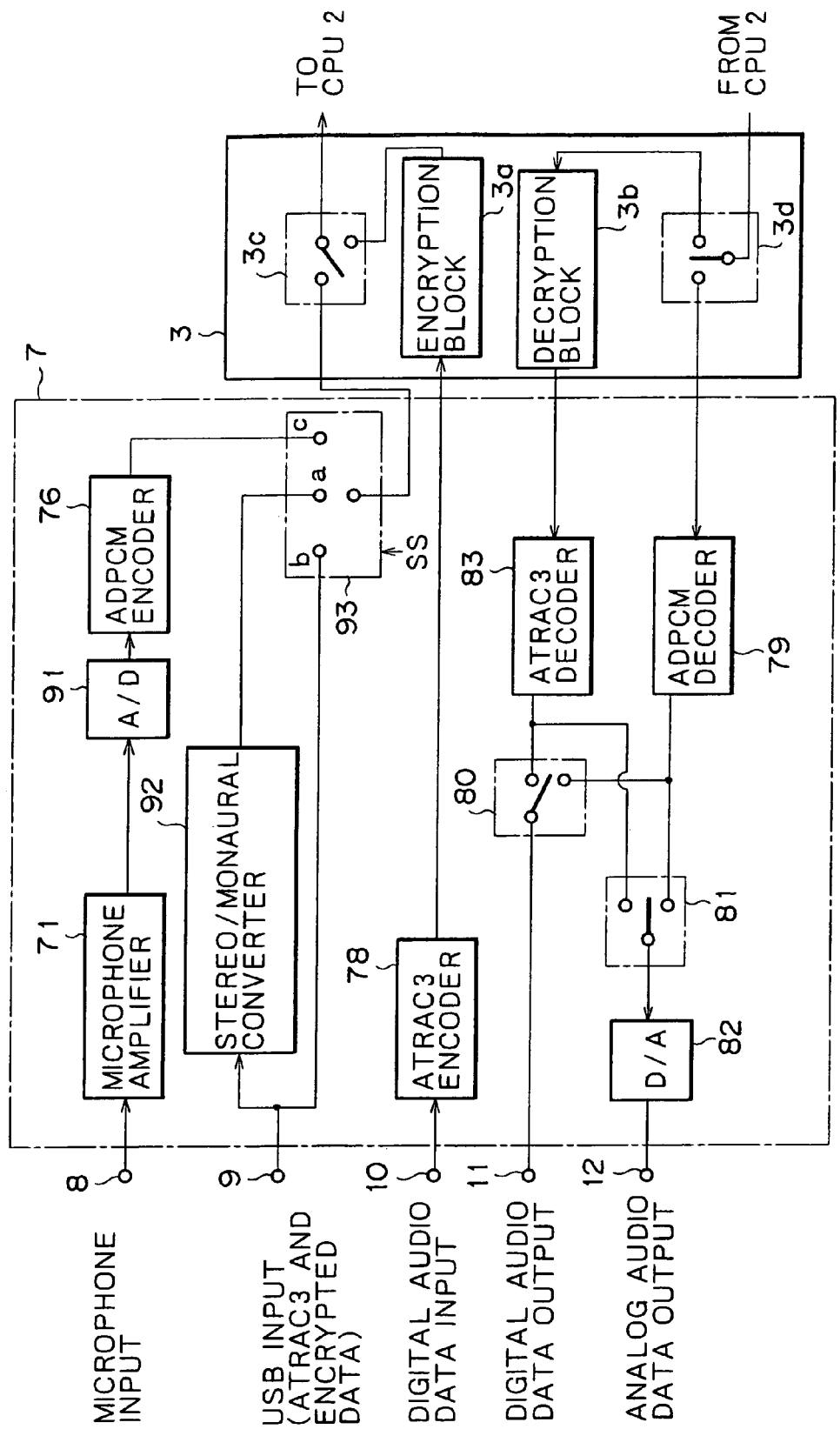
FIG. 7 is a block diagram of a memory recording and reproducing apparatus applicable to a second processing example of the invention.

FIG. 7 depicts a typical structure of the encoder/decoder 7 adapted to the alternative processing example. In FIG. 7, those parts with their functionally identical or equivalent counterparts already shown in FIG. 4 are given the same reference numerals, and detailed descriptions of such parts are omitted.

A microphone input stream by way of the terminal 8 comprises a microphone amplifier 71, an A/D converter 91 and an ADPCM encoder 76.

An audio signal as microphone input is amplified by the microphone amplifier 71 before being converted to digital data by the A/D converter 91. After the conversion, the digital data are subject to ADPCM compression by the ADPCM encoder 76. The ADPCM-compressed audio signal is sent to the security block 3 via a terminal "c" of a switch 93.

Usually, the microphone input audio signal is recorded to the memory card 40B as described above while being exempt from an encryption process. A switch 3c in the security block 3 is thus operated to let the audio signal bypass the encryption block 3a on its way to the CPU 2.

An input stream that admits digital audio data through the terminal 10 connected with an optical cable comprises an ATRAC3 encoder 78. The audio signal compressed by the ATRAC3 encoder 78 is supplied to the security block 3. In the security block 3, the audio signal is encrypted by the encryption block 3a before being sent to the CPU 2, as in the structure of FIG. 4.

Input data admitted through the USB connector terminal 9 include digital audio signals such as pieces of music supplied illustratively from the personal computer as described above. Such digital audio signals have undergone ATRAC3 compression and encryption.

In that case, there is no need for the encoder/decoder 7 to carry out an ATRAC3 compression process or for the security block 3 to perform an encryption process. Thus the input data through the terminal 9 are fed to the security block 3 via a terminal "b" of the switch 93. The switch 3c in the security block 3 is operated to let the input data bypass the encryption block 3a on their way to the CPU 2.

It should be noted that the input stream associated with the terminal 9 also includes a stereo/monaural converter 92.

The ATRAC3-processed digital audio signal entered through the terminal 9 comes with right- and left-channel data alternately multiplexed on a time division basis. The stereo/monaural converter 92 thins out the right- and left-channel data from the time division multiplexed stereo data for conversion into a monaural signal.

Thus as long as the terminal "a" of the switch 93 is connected, monaural audio data are fed to the CPU 2 as the data to be recorded.

A data output stream of the encoder/decoder 7 is made up of an ATRAC3 decoder 83, an ADPCM decoder 79, switches 80 and 81, and a D/A converter 82 as in the structure of FIG. 4.

When audio signals are admitted through the terminal 8 or 9 of the above-described encoder/decoder 7 for recoding to the inserted memory card, the CPU 2 controls the switch 93 in accordance with the established mode and the type of the memory card. Typical steps to control the switch 93 are shown in FIG. 8.

Figure 8:
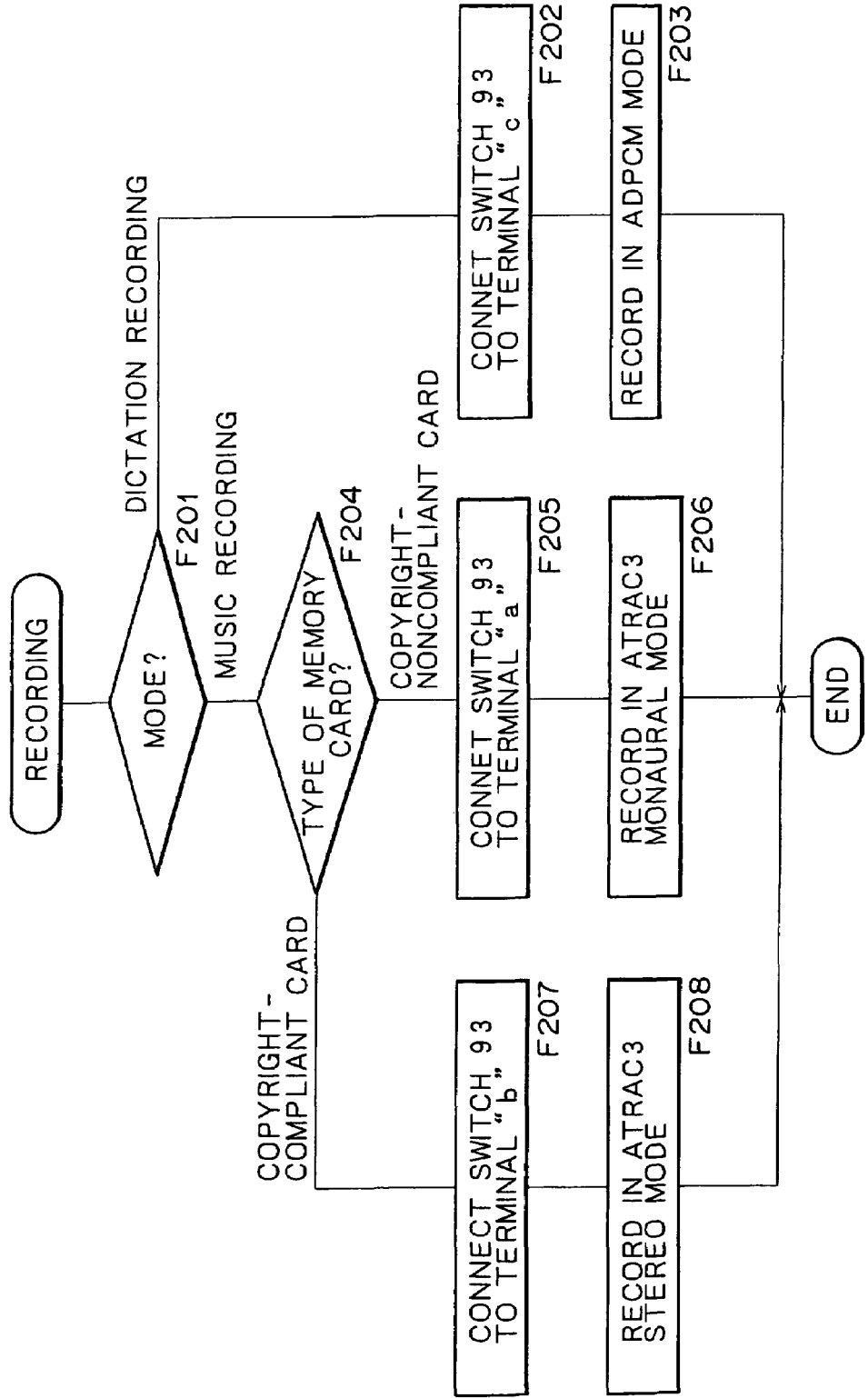
FIG. 8 is a flowchart of steps constituting the second processing example performed when the copyright-compliant or copyright-noncompliant memory card is inserted into the memory recording and reproducing apparatus.

At the time of recording, the CPU 2 first reaches step F201 of FIG. 8. In step F201, the mode judging function 2a of the CPU 2 judges the mode established by operation of the mode switch 18.

If the microphone input mode is judged to be set by the mode switch 18 (i.e., for dictation recording), the CPU 2 reaches step F202 to connect the switch 93 to its terminal "c."

In the security block 3, the switch 3c is operated to have the encryption block 3a bypassed by the flow of data.

The switch settings above complete an input stream in which an audio signal picked up by the microphone is moved from the terminal 8 to the CPU 2 after passing through the microphone amplifier 71, A/D converter 91 and ADPCM encoder 76, in that order.

The microphone input audio signal is thus recorded in ADPCM mode in step F203. That is, the signal undergoes ADPCM compression but is not subject to encryption before being recorded to the memory card. If the connected microphone is compatible with stereo input, the picked-up data are recorded as a stereo audio signal.

In the case above, the memory card 40B should be used as a rule but the memory card 40A may also be employed for dictation recording. That is, data are still recorded even if the user inadvertently inserts the memory card 40A (or intentionally when, say, a memory card 40B is not on hand).

When the microphone input mode is in effect, the switch 93 connected to its terminal "c" disables recording of data through the terminal 9. That is, music data requiring copyright protection will not be admitted through the terminal 9 for recording to the inserted memory card in the microphone input mode.

If in step F201 the line input mode is judged to be in effect, i.e., if the user wants recording of music through a data copy or relocation from the personal computer, then the CPU 2 goes to step F204. In step F204, the card judging function 2b judges the type of the inserted memory card.

If the inserted memory card is judged to be the copyright-compliant memory card 40A, step F207 is reached. In step F207, the switch 93 is connected to its terminal "b."

The setting of the switch 93 completes an input stream in which the audio signal entered through the USB connector terminal 9 (i.e., the signal is made of audio data having undergone ATRAC3 encoding and encryption) is forwarded to the CPU 2. The audio data supplied by the personal computer or the like are thus recorded in ATRAC3 mode in step F208. That is, the audio data having undergone ATRAC3 encoding and encryption are recorded to the memory card 40A.

If in step F204 the inserted memory card is judged to be the copyright-noncompliant memory card 40B, the CPU 2 reaches step F205. In step F205, the switch 93 is connected to its terminal "a."

The above setting of the switch 93 completes an input stream in which the audio signal entered through the USB connector terminal 9 (i.e., the signal is made of audio data having undergone ATRAC3 encoding and encryption) is forwarded to the CPU 2 after passing through the stereo/monaural converter 92.

That input stream converts to monaural data the stereo audio data processed through ATRAC3 encoding and encryption. In step F206, the processed data are recorded in ATRAC3 monaural mode.

In other words, the ATRAC3-encoded and encrypted audio data are lowered in signal quality through conversion from stereo to monaural format. The memory card 40B records the monaural data thus processed.

With signal quality deliberately corrupted, the recorded data are sufficient for the user's private use but are not germane to intentional violations of copyrights.

The recording operations discussed above are summarized in the table of FIG. 9.

In the microphone input mode (for dictation recording), the microphone input audio signal entered through the terminal 8 is recorded in ADPCM mode regardless of the type of the inserted memory card.

In the line input mode (for music recording), if the copyright-compliant memory card 40A is judged to be inserted, a USB data transfer admitted through the terminal 9 is recorded in ATRAC3 stereo mode, i.e., with high quality. If the copyright-noncompliant memory card 40B is judged to be inserted, the USB data transfer input through the terminal 9 is recorded in ATRAC3 monaural mode, i.e., after being converted to lower-quality data.

A digital audio signal entered through the terminal 10 may be arranged to be barred from being recorded if anything other than the memory card 40A is found inserted, e.g., if the presence of the memory card 40B deters authorization or encryption processes.

Alternatively, where the memory card 40B is inserted, the setup indicated by broken lines in FIG. 4 may be used to convert the input data to monaural format for recording to the inserted memory card.

In another alternative, where the copyright-compliant memory card 40A is inserted, the data input through the terminal 9 may be recorded to the card as a stereo audio signal having undergone high-quality compression; where the copyright-noncompliant memory card 40B is inserted, the data may be recorded as a monaural audio signal having undergone low-quality compression.

Although specific embodiments have been described above, these should not be construed as limiting the scope of the invention. The invention applies not only to portable terminal apparatuses such as recorders for dealing with music, voice and other audio data, but also to portable terminal apparatuses which handle text data, moving picture data, still picture data, and computer-ready data (programs, files, etc.).

Illustratively with regard to copyright protection, text data fall into two categories: published text data subject to copyright protection, and privately created text data such as typed sentences or diaries that are not subject to copyright protection.

Text data subject to copyright protection need to be recorded or reproduced by a security block-equipped system such as the one made up of the recorder 1 and memory card 40A described above. Text data not subject to copyright protection requirements should be recorded or reproduced by a system without a security block such as the one constituted by the recorder 1 and memory card 40B above. The invention may also be practiced as a portable terminal apparatus dealing with these kinds of text data.

This invention also applies in like manner to moving picture data, still picture data, computer-ready data and others.

In the embodiments above, nonvolatile memories exemplified by the flash memory were shown to be used as the memory cards. Alternatively, volatile memories backed up by batteries to serve as memory cards or optical memory cards may also be utilized.

In the first processing example of this invention, ATRAC was shown to be adopted as the high-quality data compression method and ADPCM as the low-quality data compression method. Alternatively, the same compression method may be adopted for both high- and low-quality data compression, with one of a plurality of bit rates selected to provide the enhanced or the lowered signal quality.

In the second processing example of this invention, the stereo signal entered as line input was shown to be converted to a monaural signal where the copyright-noncompliant memory card was inserted and the line input mode was selected. Alternatively, where an m-channel audio signal, "m" being at least an integer of 2, is input to the line input terminal, the input signal may be thinned out to provide an n-channel audio signal, "n" being an integer not greater than "m."

This invention applies not only to Memory Stick (registered trademark) which is a copyright-compliant/noncompliant memory card proposed by this applicant, but also to memory card recording and reproducing apparatuses for use with such diverse flash memories as: Secured Multi Media Card (registered trademark of Infineon Technologies AG, Germany), a copyright-compliant/noncompliant memory card proposed by San Disk and Hitachi Ltd.; SD Card (registered trademark of Infineon Technologies AG, Germany) proposed by San Disk, Toshiba and Matsushita; and Compact Flash Memory Card (registered trademark) proposed by San Disk.

As described, when loaded with a copyright-compliant memory, one portable terminal apparatus according to the invention causes the memory to record an input signal having undergone a first compression process. When loaded with a copyright-noncompliant memory, the inventive portable terminal apparatus causes the memory to record an input signal having undergone a second compression process that ensures lower data quality than the first compression process. That is, whenever the copyright-noncompliant memory is loaded, the line input signal is recorded at a reduced quality level. This makes it impossible for unscrupulous third parties to violate copyrights, while users are allowed to make recordings for private utilization. If an inappropriate type of memory card is inserted, users are still allowed to record data to the memory at a lowered level of data quality for copyright protection while avoiding confusion or inconveniences such as mistaking inoperativeness for a system defect or an outright mechanical failure to record the necessary data.

When loaded with a copyright-compliant memory, another portable terminal apparatus according to the invention causes the memory to record an input digital audio signal (line input signal) subjected to the first compression process; when furnished with a copyright-noncompliant memory, the inventive portable terminal apparatus causes the memory to record an audio signal having undergone the second compression process ensuring the lowered data quality than the first process. The portable terminal apparatus also subjects a microphone input signal to the second compression process before recording the signal to the memory. The arrangements make it possible to eliminate users' inconveniences caused by inadvertent insertion of the wrong memory card while protecting copyrights. This portable terminal apparatus is used advantageously to record microphone inputs that may be stored regardless of the type of the inserted memory.

When loaded with a copyright-compliant memory, yet another portable terminal apparatus according to the invention causes the memory to record an input stereo signal having undergone the first compression process; when furnished with a copyright-noncompliant memory, the inventive portable terminal apparatus converts the stereo signal to a monaural signal (i.e., corrupts the line input signal in quality) before recording the signal to the memory. The arrangements thus make it possible to eliminate users' inconveniences caused by inadvertent insertion of the inappropriate memory card while protecting copyrights.

Where line input mode is in effect, a further portable terminal apparatus according to the invention and loaded with a copyright-compliant memory causes the memory to record an input digital audio signal (i.e., line input stereo signal) unmodified. When furnished with a copyright-noncompliant memory, the inventive portable terminal apparatus converts the input digital audio signal into a monaural signal before recording the signal to the memory. Where microphone input mode is in effect, microphone input signal is recorded in the memory. The arrangements thus make it possible to eliminate users' inconveniences caused by inadvertent insertion of the inappropriate memory card while protecting copyrights. In addition, this portable terminal apparatus is also used advantageously to record microphone inputs that may be stored regardless of the type of the inserted memory.

As many apparently different embodiments of this invention may be made without departing from the spirit and scope thereof, it is to be understood that the invention is not limited to the specific embodiments thereof except as defined in the appended claims.

What is claimed is:

1. A terminal apparatus into which any one of a first and a second memory card is selectively inserted, said first memory card carrying a signal processing circuit for copyright protection, said second memory card not carrying a signal processing circuit for copyright protection, said terminal apparatus comprising:
   converting means for converting an m-channel audio signal, m being an integer of at least 2, into an n-channel audio signal, n being a positive integer not greater than m;
   selecting means for selecting either an input m-channel audio signal or the converted n-channel audio signal from said converting means;
   security means for executing an authorization process by exchanging authorization data with the signal processing circuit of a memory card inserted into said terminal to determine whether said memory card supports copyright protection;
   judging means for judging whether the memory card inserted into said terminal apparatus is said first memory card or said second memory card on the basis of the authorization process performed by the security means;
   controlling means for controlling said selecting means in accordance with a judgment made by said judging means; and
   recording means for recording the audio signal selected by said controlling means to the inserted memory card.

2. A terminal apparatus according to claim 1, wherein said first memory card and said second memory card are substantially the same in shape.

3. A terminal apparatus according to claim 1, wherein contents to be recorded which are subject to copyright protection include music, videos and games provided by copyright holders.

4. A terminal apparatus according to claim 1, wherein, if said inserted memory card is judged by said judging means to be said first memory card, then said controlling means selects said m-channel audio signal and records the selected signal to the inserted first memory card.

5. A terminal apparatus according to claim 1, wherein, if said inserted memory card is judged by said judging means to be said second memory card, then said controlling means selects said n-channel audio signal and records the selected signal to the inserted second memory card.

6. A terminal apparatus into which any one of a first and a second memory card is selectively inserted, said first memory card carrying a signal processing circuit for copyright protection, said second memory card not carrying a signal processing circuit for copyright protection, said terminal apparatus comprising:

compression processing means for applying a second compression process to an input first compressed signal having undergone a first compression process, said second compression process being inferior to said first compression process in terms of compression efficiency;

selecting means for selecting either said first compressed signal having undergone said first compression process, or a second compressed signal furnished by said compression processing means;

security means for executing an authorization process by exchanging authorization data with the signal processing circuit of a memory card inserted into said terminal to determine whether said memory card supports copyright protection;

judging means for judging whether the memory card inserted into said terminal apparatus is said first memory card or said second memory card on the basis of the authorization process performed by the security means;

controlling means for controlling said selecting means in accordance with a judgment made by said judging means; and recording means for recording the compressed signal selected by said controlling means to the inserted memory card.

7. A terminal apparatus according to claim 6, wherein said first compression process is an adaptive transform acoustic coding process known as ATRAC and said second compression process is an adaptive differential pulse code modulation process known as ADPCM.

8. A terminal apparatus according to claim 6, wherein said first compression process is superior to said second compression process in terms of compression efficiency.

9. A terminal apparatus according to claim 6, wherein said first memory card and said second memory card are substantially the same in shape.

10. A terminal apparatus according to claim 6, wherein contents to be recorded which are subject to copyright protection include music, videos and games provided by copyright holders.

11. A terminal apparatus according to claim 6, wherein, if said inserted memory card is judged by said judging means to be said first memory card, then said controlling means selects said first compressed signal and records the selected signal to the inserted first memory card.

12. A terminal apparatus according to claim 6, wherein, if said inserted memory card is judged by said judging means to be said second memory card, then said controlling means selects said second compressed signal and records the selected signal to the inserted second memory card.

13. A terminal apparatus into which any one of a first and a second memory card is selectively inserted, said first memory card carrying a signal processing circuit for copyright protection, said second memory card not carrying a signal processing circuit for copyright protection, said terminal apparatus comprising:

microphone inputting means for inputting an analog audio signal picked up by a microphone;

converting means for converting a line input m-channel digital audio signal, m being an integer of at least 2, into an n-channel digital audio signal, n being a positive integer not greater than m;

selecting means for selecting either the line input m-channel digital audio signal or the converted n-channel digital audio signal from said converting means;

operating means for setting either a digital audio signal recording mode in which to record said line input m-channel digital audio signal, or an analog audio signal recording mode in which to record said analog audio signal input by said microphone inputting means;

security means for executing an authorization process by exchanging authorization data with the signal processing circuit of a memory card inserted into said terminal to determine whether said memory card supports copyright protection;

judging means for judging whether the memory card inserted into said terminal apparatus is said first memory card or said second memory card on the basis of the authorization process performed by the security means;

controlling means for controlling said selecting means in accordance with a judgment made by said judging means and with the mode set by said operating means; and recording means for recording the audio signal selected by said controlling means to the inserted memory card.

14. A terminal apparatus according to claim 13, wherein, if said operating means selects the digital audio signal recording mode in which to record said line input m-channel digital audio signal and if said judging means judges said inserted memory card to be said first memory card, then said controlling means causes said line input m-channel digital audio signal to be selected.

15. A terminal apparatus according to claim 13, wherein, if said operating means selects the digital audio signal recording mode in which to record said line input m-channel digital audio signal and if said judging means judges said inserted memory card to be said second memory card, then said controlling means causes said n-channel digital audio signal output from said converting means to be selected.

16. A terminal apparatus into which any one of a first and a second memory card is selectively inserted, said first memory card carrying a signal processing circuit for copyright protection, said second memory card not carrying a signal processing circuit for copyright protection, said terminal apparatus comprising:

a first input terminal through which to input an analog audio signal picked up by a microphone;

a second input terminal through which to input a digital audio compressed signal having undergone a first compression process;

decompressing means for decompressing the digital audio compressed signal input through said second input terminal;

D/A converting means for converting a decompressed digital audio signal from said decompressing means into an analog audio signal;

first switching means for selecting either an analog audio signal which, having being picked up by said microphone, is input through said first input terminal, or the converted analog audio signal from said D/A converting means;

A/D converting means for converting the selected analog audio signal from said first switching means into a digital audio signal;

compression processing means for subjecting the converted digital audio signal from said A/D converting means to a second compression process which is different from said first compression process;

second switching means for selecting either a digital audio compressed signal which, having undergone said first compression process, is input through said second input terminal, or a digital audio compressed signal which, having undergone said second compression process, is output from said compression processing means;

security means for executing an authorization process by exchanging authorization data with the signal processing circuit of a memory card inserted into said terminal to determine whether said memory card supports copyright protection;

judging means for judging whether the memory card inserted into said terminal apparatus is said first memory card or said second memory card on the basis of the authorization process performed by the security means;

controlling means for controlling said first and said second switching means in accordance with a judgment made by said judging means; and recording means for recording the digital audio compressed signal selected by said second switching means to the inserted memory card.

17. A terminal apparatus according to claim 16, further comprising mode operating means for selectively setting either a microphone input mode in which the analog audio signal input from said microphone is recorded to said inserted memory card, or a line input mode in which the digital audio compressed signal having undergone said first compression process and input through said second input terminal is recorded to said inserted memory card;

wherein, if said mode operating means selects said microphone input mode, then said controlling means causes said first switching means to select the analog audio signal picked up by said microphone and input through said first input terminal, and causes said second switching means to select the digital audio compressed signal having undergone said second compression process and output from said compression processing means.

18. A terminal apparatus according to claim 16, further comprising mode operating means for selectively setting either a microphone input mode in which the analog audio signal input from said microphone is recorded to said inserted memory card, or a line input mode in which the digital audio compressed signal having undergone said first compression process and input through said second input terminal is recorded to said inserted memory card;

wherein, if said mode operating means selects said line input mode and if said judging means judges said inserted memory card to be said first memory card, then said controlling means causes the digital audio compressed signal having undergone said first compression process and input through said second input terminal to be selected.

19. A terminal apparatus according to claim 16, further comprising mode operating means for selectively setting either a microphone input mode in which the analog audio signal input from said microphone is recorded to said inserted memory card, or a line input mode in which the digital audio compressed signal having undergone said first compression process and input through said second input terminal is recorded to said inserted memory card;

wherein, if said mode operating means selects said line input mode and if said judging means judges said inserted memory card to be said second memory card, then said controlling means causes said second switching means to select the digital audio compressed signal having undergone said second compression process and output from said compression processing means.

* * * * *